United States Patent [19]

Thomas et al.

[11] 4,133,685

[45] Jan. 9, 1979

[54] LITHOGRAPHIC PLATE AND PHOTORESIST HAVING PHOTOSENSITIVE LAYERS OF DIAZO AND CINNAMOYLATED POLYVINYL ALCOHOL MATERIALS

[75] Inventors: Daniel C. Thomas, Wheaton, Ill.; Jack L. Sorkin, University Heights, Ohio

[73] Assignee: Richardson Chemical Company, Des Plaines, Ill.

[21] Appl. No.: 870,197

[22] Filed: Jan. 17, 1978

Related U.S. Application Data

[63] Continuation of Ser. No. 755,932, Dec. 30, 1976, abandoned, which is a continuation of Ser. No. 541,455, Jan. 16, 1975, abandoned, which is a continuation-in-part of Ser. No. 435,340, Jan. 21, 1974, abandoned, which is a continuation of Ser. No. 829,149, May 29, 1969, Pat. No. 3,808,004.

[51] Int. Cl.² .................. G03C 1/52; G03C 1/68; G03F 7/08

[52] U.S. Cl. .................................... 96/68; 96/33; 96/35.1; 96/36; 96/36.2; 96/36.3; 96/75; 96/86 P; 96/115 R

[58] Field of Search ............... 96/33, 68, 75, 36, 35.1, 96/115 R, 115 P

[56] References Cited

U.S. PATENT DOCUMENTS

| | | | |
|---|---|---|---|
| 2,610,120 | 9/1952 | Minsk et al. | 96/115 R |
| 3,136,637 | 6/1964 | Larson | 96/75 |
| 3,173,787 | 3/1965 | Clement | 96/36.3 |
| 3,376,139 | 4/1968 | Giangualano et al. | 96/36 |
| 3,387,976 | 6/1968 | Sorkin | 96/35.1 |
| 3,462,267 | 8/1969 | Giangualano et al. | 96/33 |
| 3,622,331 | 11/1971 | Thomas | 96/68 |
| 3,652,272 | 3/1972 | Thomas | 96/33 |
| 3,808,004 | 4/1974 | Thomas et al. | 96/68 |

Primary Examiner—Charles L. Bowers, Jr.

[57] ABSTRACT

A photopolymerizable coating over a diazo resin provides a high-speed lithographic plate or photoresist while improving the printing life of the plate while making its development simpler than that of most other photopolymer plates. The photopolymer is a cinnamoylated polyvinyl alcohol resin which is placed over a diazo based material.

1 Claim, No Drawings

LITHOGRAPHIC PLATE AND PHOTORESIST HAVING PHOTOSENSITIVE LAYERS OF DIAZO AND CINNAMOYLATED POLYVINYL ALCOHOL MATERIALS

CROSS REFERENCE TO RELATED APPLICATIONS

This application is a continuation of application Ser. No. 755,932 filed Dec. 30, 1976, now abandoned, which is a continuation of application Ser. No. 541,455 filed Jan. 16, 1975, abandoned, and which is a continuation-in-part application of copending application Ser. No. 435,340 filed Jan. 21, 1974, abandoned, which is a continuation application of application Ser. No. 829,149 filed May 29, 1969 and issued as U.S. Pat. No. 3,808,004 on Apr. 30, 1974.

INCORPORATION BY REFERENCE

This application incorporates by specific reference U.S. Pat. No. 3,808,004 issued Apr. 30, 1974, having Daniel C. Thomas and Jack L. Sorkin as inventors and assigned to the Richardson Graphics Company, Chicago, Ill. Said patent is based on application Ser. No. 829,149 filed May 29, 1969.

An abstract of said reference follows:

In such patent a photopolymerizable coating over a diazo resin is used to provide high-speed lithographic plate or a photoresist while also improving the run length of the plate incorporating the combination. Additionally, improved development of the plate occurs. The photopolymer comprises a cinnamoylated resin.

A brief summary of the referenced patent follows:

The invention of said referenced patent generally resides in a two layer lithographic or photoresist plate in which a cinnamoylated photopolymer is placed over a diazo resin base in order to engender the above stated advantageous properties.

There are no drawings in the referenced patent.

A representative claim in the referenced patent is as follows:

A high-speed presensitized plate for lithography or photoresist etching comprising in combination, a plate base, a sub-base coating over the plate base, a light sensitive diazo resin condensation product of an aldehyde and a diazonium compound layer over the sub-base coating and a phenoxy cinnamate photopolymer coating over the diazo resin layer.

Regarding the present invention, in Example 7 of the referenced patent lithograph printing plates were made with either an alkyd resin or an aryl allyl ester resin placed over a diazo resin layer. Thereafter plates containing these resins were exposed and tested for bench and press results. The data in Example 7 indicate that the aryl allyl ester and diazo combination when exposed and developed in a standard method yielded a run length of about 35,000 copies.

Compared to the present invention (cinnamoylated polyvinyl alcohol polymer over a diazo resin) the system of an aryl allyl ester over diazo resin was inferior as illustrated by the reported data in columns 13–14 of said U.S. Pat. No. 3,808,004 for plates 28$b$, 28$c$, 28$d$, 29$b$, 29$c$, 29$d$, 30$b$ and 32$b$ which showed an improved run length associated with the claimed system. More particularly, plate 28$d$ showed that for a 10 second exposure over 110,000 copy run lengths could be attained. Compared to the 35,000 copy run length for the aryl allyl ester over a diazo resin, a substantial improvement was realized.

The degree of cinnamoylation of the polyvinyl alcohol resin, as shown by the above data, reflects the degree of improvement achieved regarding press test run lengths. More particularly, plates 28$c$, 28$d$ and 29$b$, which were essentially 100% cinnamoylated, had run lengths for exposure times varying from 10 seconds to 2 minutes of all over 100,000 copies. This illustrates, more particularly, the improved results for the claimed invention especially when compared to the aryl allyl ester system.

We claim as our invention:

1. A high-speed presensitized plate for lithography or photoresist etching, including in combination a plate base, a sub-base coating over said plate base, a layer of a light sensitive diazo resin condensation product of an aldehyde and a diazonium compound over the sub-base coating and a cinnamate photopolymer coating over said diazo resin layer, wherein the photopolymer coating contains cinnamoylated polyvinyl alcohol polymer.

* * * * *

UNITED STATES PATENT AND TRADEMARK OFFICE
CERTIFICATE OF CORRECTION

PATENT NO. : 4,133,685
DATED : January 9, 1979
INVENTOR(S) : Daniel C. Thomas and Jack L. Sorkin It is certified that error appears in the above–identified patent and that said Letters Patent are hereby corrected as shown below:

Correct the name of the assignee appearing on the first page of the Letters Patent document from "Richardson Chemical Company" to --The Richardson Company--.

Signed and Sealed this

Twelfth Day of February 1980

[SEAL]

Attest:

SIDNEY A. DIAMOND

Attesting Officer

Commissioner of Patents and Trademarks